(12) United States Patent
Shao et al.

(10) Patent No.: US 12,241,948 B2
(45) Date of Patent: Mar. 4, 2025

(54) ASYMMETRIC COMPENSATION METHOD AND APPARATUS FOR TWO-PORT NEAR FIELD PROBE, COMPUTER DEVICE, AND STORAGE MEDIUM

(71) Applicants: CHINA ELECTRONIC PRODUCT RELIABILITY AND ENVIRONMENTAL TESTING RESEARCH INSTITUTE (THE FIFTH ELECTRONIC RESEARCH INSTITUTE OF MINISTRY OF INDUSTRY AND INFORMATION TECHNOLOGY) (CEPREI), Guangzhou (CN); SOUTH CHINA UNIVERSITY OF TECHNOLOGY, Guangzhou (CN)

(72) Inventors: Weiheng Shao, Guangzhou (CN); Yinghui Chen, Guangzhou (CN); Yiqiang Chen, Guangzhou (CN); Changjian Zhou, Guangzhou (CN)

(73) Assignees: CHINA ELECTRONIC PRODUCT RELIABILITY AND ENVIRONMENTAL TESTING RESEARCH INSTITUTE (THE FIFTH ELECTRONIC RESEARCH INSTITUTE OF MINISTRY OF INDUSTRY AND INFORMATION TECHNOLOGY) (CEPREI), Guangzhou (CN); SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 18/655,857

(22) Filed: May 6, 2024

(65) Prior Publication Data
US 2024/0402265 A1 Dec. 5, 2024

(30) Foreign Application Priority Data

Jun. 5, 2023 (CN) .......................... 202310652188.7

(51) Int. Cl.
*G01R 33/025* (2006.01)
*G01R 27/32* (2006.01)
*G01R 35/00* (2006.01)

(52) U.S. Cl.
CPC .......... *G01R 33/025* (2013.01); *G01R 27/32* (2013.01); *G01R 35/005* (2013.01)

(58) Field of Classification Search
None
See application file for complete search history.

(56) References Cited

U.S. PATENT DOCUMENTS

| 2,172,597 | A | 12/1992 | Hadeen |
|---|---|---|---|
| 5,172,597 | A | 12/1992 | Hadeen |

(Continued)

FOREIGN PATENT DOCUMENTS

| CN | 106100760 A | 11/2016 |
|---|---|---|
| CN | 107533122 A | 1/2018 |

(Continued)

OTHER PUBLICATIONS

CN115113124A translation (Year: 2022).*

(Continued)

*Primary Examiner* — Lina Cordero
(74) *Attorney, Agent, or Firm* — Quarles & Brady LLP

(57) ABSTRACT

The present disclosure relates to an asymmetric compensation method and apparatus for a two-port near field probe, a device, and a storage medium. The method includes: obtaining a first scattering parameter collected by a symmetric two-port network established based on a symmetric two-port near field probe; obtaining a second scattering parameter collected by an asymmetric two-port network established (Continued)

based on an asymmetric element; obtaining an overall response of a calibration network in a magnetic field environment, the calibration network being established based on the symmetric two-port near field probe and the asymmetric element; calculating a calibration factor based on the scattering parameter of the symmetric two-port near field probe, the scattering parameter of the asymmetric element, and the overall response of the calibration network in the magnetic field environment; and compensating the symmetric two-port near field probe according to a calibration factor.

11 Claims, 8 Drawing Sheets

(56) References Cited

U.S. PATENT DOCUMENTS

| | | | |
|---|---|---|---|
| 5,442,296 A * | 8/1995 | Schiek | G01R 35/005 702/85 |
| 9,000,776 B1 | 4/2015 | Tam et al. | |
| 2003/0115008 A1 * | 6/2003 | Doi | G01R 1/06772 702/117 |
| 2010/0204941 A1 | 8/2010 | Heuermann | |

FOREIGN PATENT DOCUMENTS

| | | | |
|---|---|---|---|
| CN | 113900058 A | | 1/2022 |
| CN | 115113124 A | | 9/2022 |
| CN | 116165411 A | * | 5/2023 |
| CN | 116381467 B | * | 9/2023 |
| CN | 116819417 A | * | 9/2023 |
| GB | 2366619 A | | 3/2002 |

OTHER PUBLICATIONS

CN116381467B translation (Year: 2023).*
CN116819417A translation (Year: 2023).*
CN116165411A translation (Year: 2023).*
W. Shao, Z. Yi, X. He, W. Fang, C. Zhou and J. Liu, "Novel Calibration Method for the Asymmetric Probing in the Near-Field Measurement With a Dual Probe," in IEEE Transactions on Microwave Theory and Techniques, vol. 69, No. 12, pp. 5439-5448, Dec. 2021 (Year: 2021).*
Office Action, Chinese Patent Application No. 202310652188.7, Jul. 10, 2023, with English translation.
Grant Decision, Chinese Patent Application No. 202310652188.7, Jul. 25, 2023, with English translation.
Chen Zhijian et al., Design of Ultra-Wideband Active Magnetic Field Probe for Near-Field Measurements, Journal of South China University of Technology (Natural Science Edition), vol. 49, Issue 6, pp. 131-139, Jun. 30, 2021.
Zhao Wensheng et al., A Review on Microwave Resonant Sensors, Journal of Electronics, Issue 10, pp. 2530-2541, Oct. 31, 2022.
Jin Shi et al., Calibration and Compensation of Near-Field Scan Measurements, IEEE Transactions on Electromagnetic Compatibility, vol. 47, Issue 3, pp. 642-650, Aug. 31, 2005.

* cited by examiner

ASYMMETRIC COMPENSATION METHOD AND APPARATUS FOR TWO-PORT NEAR FIELD PROBE, COMPUTER DEVICE, AND STORAGE MEDIUM

CROSS-REFERENCE TO RELATED APPLICATIONS

This application claims priority to Chinese patent application No. 2023106521887 filed with the Chinese Patent Office on Jun. 5, 2023, entitled "ASYMMETRIC COMPENSATION METHOD AND APPARATUS FOR TWO-PORT NEAR FIELD PROBE, DEVICE, AND STORAGE MEDIUM", the entire content of which is incorporated by reference.

TECHNICAL FIELD

The present disclosure relates to the technical field of probe calibration, and particularly to an asymmetric compensation method and apparatus for a two-port near field probe, a computer device, and a storage medium.

BACKGROUND

With the rapid development of science and technology, integrated circuits are becoming more miniaturized, high-frequency, and high-density. This technology facilitates people's lives but also results in the problem of reduced electromagnetic reliability of the integrated circuits.

Near field scanning technique is an effective diagnostic method for detecting electromagnetic reliability, and therefore, it is used in conventional techniques to address the issue of electromagnetic reliability reduction in integrated circuits. In the near field scanning, near field probes are important components for realizing the near field scanning, and composite probes offer significant advantages as a type of near field probes. However, the composite probe often faces asymmetry issues during application. Therefore, it is of great significance to solve the asymmetry problem of composite probes and to compensate for the asymmetry of near-field probes.

SUMMARY

According to a first aspect, the present disclosure provides an asymmetric compensation method for a two-port near field probe. The method includes: obtaining a first scattering parameter of a symmetric two-port near field probe, the first scattering parameter is collected by a symmetric two-port network, the symmetric two-port network includes the symmetric two-port near field probe and a vector network analyzer, the symmetric two-port near field probe includes a second port and a fifth port, the vector network analyzer includes a first interface, a second interface, a third interface, and a fourth interface, the second port is connected to the second interface of the vector network analyzer;

obtaining a second scattering parameter of an asymmetric element, the second scattering parameter is collected by an asymmetric two-port network, the asymmetric two-port network includes the asymmetric element and the vector network analyzer, a third port of the asymmetric element is an output port and is connected to the third interface of the vector network analyzer, an input port of the asymmetric element is connected to the fifth port of the symmetric two-port near field probe;

obtaining an overall response of a calibration network in a magnetic field environment, the calibration network is established based on the symmetric two-port near field probe and the asymmetric element, the calibration network the vector network analyzer, the symmetric two-port near field probe, the asymmetric element, and a calibrator, a first port and a fourth port arranged at two sides of the calibrator are connected to the first interface and the fourth interface of the vector network analyzer, respectively, the second port of the symmetric two-port near field probe is connected to the second interface of the vector network analyzer, the fifth port of the symmetric two-port near field probe is connected to the asymmetric element, and the third port of the asymmetric element is connected to the third interface of the vector network analyzer;

calculating a calibration factor based on the first scattering parameter of the symmetric two-port near field probe, the second scattering parameter of the asymmetric element, and the overall response of the calibration network in the magnetic field environment; and compensating the symmetric two-port near field probe according to the calibration factor.

In some embodiments, calculating the calibration factor based on the first scattering parameter of the symmetric two-port near field probe, the second scattering parameter of the asymmetric element, and the overall response of the calibration network in the magnetic field environment includes: performing a calculation based on the first scattering parameter of the symmetric two-port near field probe, the second scattering parameter of the asymmetric element, and the overall response of the calibration network in the magnetic field environment to obtain a response of the symmetric two-port near field probe in the magnetic field environment; and determining the calibration factor based on the response of the symmetric two-port near field probe in the magnetic field environment.

In some embodiments, performing the calculation based on the first scattering parameter of the symmetric two-port near field probe, the second scattering parameter of the asymmetric element, and the overall response of the calibration network in the magnetic field environment to obtain the response of the symmetric two-port near field probe in the magnetic field environment includes: constructing a first transmission equation based on a first transmission link of the calibration network; constructing a second transmission equation based on a second transmission link of the calibration network, the first transmission link and the second transmission link being transmission links of the symmetric two-port near field probe in two opposite directions; and determining the response of the symmetric two-port near field probe in the magnetic field environment based on the first scattering parameter of the symmetric two-port near field probe, the second scattering parameter of the asymmetric element, the first transmission equation, and the second transmission equation.

In some embodiments, determining the response of the symmetric two-port near field probe in the magnetic field environment based on the first scattering parameter of the symmetric two-port near field probe, the second scattering parameter of the asymmetric element, the first transmission equation, and the second transmission equation includes:

transforming the first transmission equation and the second transmission equation to obtain a first response expression of the symmetric two-port near field probe in the magnetic field environment and a second response expression of the symmetric two-port near field probe in the magnetic field environment, respectively;

calculating a first response of the symmetric two-port near field probe in the magnetic field environment based on the overall response of the calibration network in the magnetic field environment, the scattering parameter of the symmetric two-port near field probe, the scattering parameter of the asymmetric element, a preset characteristic parameter, and the first response expression; and extracting an overall response of the second transmission link from the overall response of the calibration network in the magnetic field environment, and calculating a second response of the symmetric two-port near field probe in the magnetic field environment based on the overall response of the second transmission link, the second scattering parameter of the asymmetric element, the preset characteristic parameter, and the second response expression.

In some embodiments, determining the calibration factor based on the response of the symmetric two-port near field probe in the magnetic field environment includes: determining an output voltage of the calibration network based on the response of the symmetric two-port near field probe in the magnetic field environment and a preset voltage expression; and obtaining a magnetic field signal, and obtaining the calibration factor based on the magnetic field signal and the output voltage.

In some embodiments, obtaining the calibration factor based on the magnetic field signal and the output voltage includes: multiplying a logarithm of the magnetic field signal by a preset multiplier to obtain a magnetic field product; dividing the output voltage by an input signal to obtain a signal divisor and determining an absolute value of the signal divisor; and calculating a difference between the magnetic field product and the absolute value of the signal divisor to obtain the calibration factor.

In some embodiments, the symmetric two-port near field probe is located on a preset track of the calibrator.

According to a second aspect, the present disclosure also provides an asymmetric compensation apparatus for a two-port near field probe. The apparatus includes a first obtaining module, a second obtaining module, a response obtaining module, a calculation module, and a compensation module. The first obtaining module is configured to obtain a first scattering parameter of a symmetric two-port near field probe. The first scattering parameter is collected by a symmetric two-port network. The symmetric two-port network includes the symmetric two-port near field probe and a vector network analyzer. The symmetric two-port near field probe includes a second port and a fifth port. The vector network analyzer includes a first interface, a second interface, a third interface, and a fourth interface, and the second port is connected to the second interface of the vector network analyzer. The second obtaining module is configured to obtain a second scattering parameter of an asymmetric element, wherein the second scattering parameter is collected by an asymmetric two-port network. The asymmetric two-port network includes the asymmetric element and the vector network analyzer. A third port of the asymmetric element is an output port and is connected to the third interface of the vector network analyzer, and an input port of the asymmetric element is connected to the fifth port of the symmetric two-port near field probe. The response obtaining module is configured to obtain an overall response of a calibration network in a magnetic field environment, wherein the calibration network is established based on the symmetric two-port near field probe and the asymmetric element. The calibration network includes the vector network analyzer, the symmetric two-port near field probe, the asymmetric element, and a calibrator. A first port and a fourth port arranged at two sides of the calibrator are connected to the first interface and the fourth interface of the vector network analyzer, respectively. The second port of the symmetric two-port near field probe is connected to the second interface of the vector network analyzer, the fifth port of the symmetric two-port near field probe is connected to the asymmetric element, and the third port of the asymmetric element is connected to the third interface of the vector network analyzer. The calculation module is configured to calculate a calibration factor according to the first scattering parameter of the symmetric two-port near field probe, the second scattering parameter of the asymmetric element, and the overall response of the calibration network in the magnetic field environment. The compensation module is configured to compensate for the symmetric two-port near field probe according to the calibration factor.

According to a third aspect, the present disclosure also provides a computer device. The computer device includes a memory and a processor, and the memory stores a computer program. The processor, when executing the computer program, performs the asymmetric compensation method for a two-port near field probe according to any one of the above-described embodiments.

According to a fourth aspect, the present disclosure further provides a non-transitory computer readable storage medium having stored therein a computer program. The computer program, when executed by a processor, causes the processor to perform the asymmetric compensation method for a two-port near field probe according to any one of the above-described embodiments.

According to a fifth aspect, the present disclosure further provides a computer program product, which includes a computer program. The computer program, when executed by a processor, causes the processor to perform the asymmetric compensation method for a two-port near field probe according to any one of the above-described embodiments.

BRIEF DESCRIPTION OF DRAWINGS

In order to illustrate the technical solutions in the embodiments of the present disclosure or conventional technology more clearly, the accompanying drawings used in the description of the embodiments or conventional technology will be briefly introduced below. Apparently, the accompanying drawings in the following description are only some embodiments of the present disclosure. For those of ordinary skill in the art, other drawings can also be derived from these drawings without creative effort.

DETAILED DESCRIPTION OF THE EMBODIMENTS

To make the purposes, technical solutions, and advantages of the present disclosure clearer, the present disclosure will be described in detail with reference to the accompanying drawings and embodiments. It should be understood that the specific embodiments described herein are merely intended to explain the present disclosure and are not intended to limit the present disclosure.

Conventional composite probes are based on symmetry. However, asymmetric factors are inevitably introduced in actual production and application, which will greatly affect the detection accuracy of the probes. At present, there is no relevant technical solution for asymmetric compensation measurement, while the asymmetric problem is a common problem in two-port near field detection systems. Severe asymmetry may lead to system measurement failure. The present disclosure can solve the problem of asymmetry during the application of composite probes.

Figure 1:
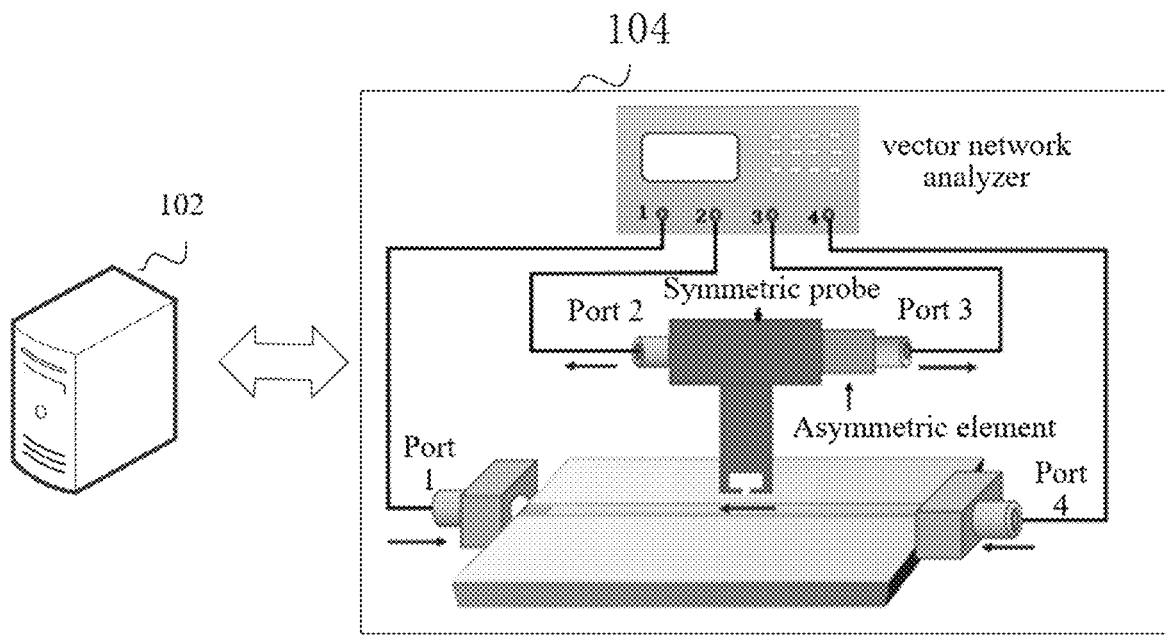
FIG. 1 is an application environment diagram of an asymmetric compensation method for a two-port near field probe according to an embodiment.

An asymmetric compensation method for a two-port near field probe provided in embodiments of the present disclosure can be applied in an application environment shown in FIG. 1. In this environment, a terminal 102 communicates with a calibration network 104 via a network. The terminal 102 obtains a first scattering parameter of the symmetric two-port near field probe, which is collected by a symmetric two-port network established based on the symmetric two-port near field probe, and obtains a second scattering parameter of the asymmetric element, which is collected by an asymmetric two-port network established based on the asymmetric element. The terminal 102 further obtains an overall response of the calibration network 104 in a magnetic field environment. The calibration network 104 is established based on the symmetric two-port near field probe and the asymmetric element. The terminal 102 calculates a calibration factor based on the first scattering parameter of the symmetric two-port near field probe, the second scattering parameter of the asymmetric element, and the overall response of the calibration network 104 in the magnetic field environment, and compensates the symmetric two-port near field probe based on the calibration factor. The terminal 102 may be, but is not limited to, various personal computers, laptops, smartphones, tablets, Internet of Things devices, and portable wearable devices. The Internet of Things device may be a smarts speaker, a smart television, a smart air conditioner, a smart in-vehicle device, etc. The portable wearable device may be a smart watch, a smart bracelet, a head-mounted device, etc. The asymmetric compensation method for a two-port near field probe provided in the present disclosure is applicable to composite electromagnetic field detection systems, differential magnetic field detection systems, and differential dual-loop magnetic field detection systems.

Figure 2:
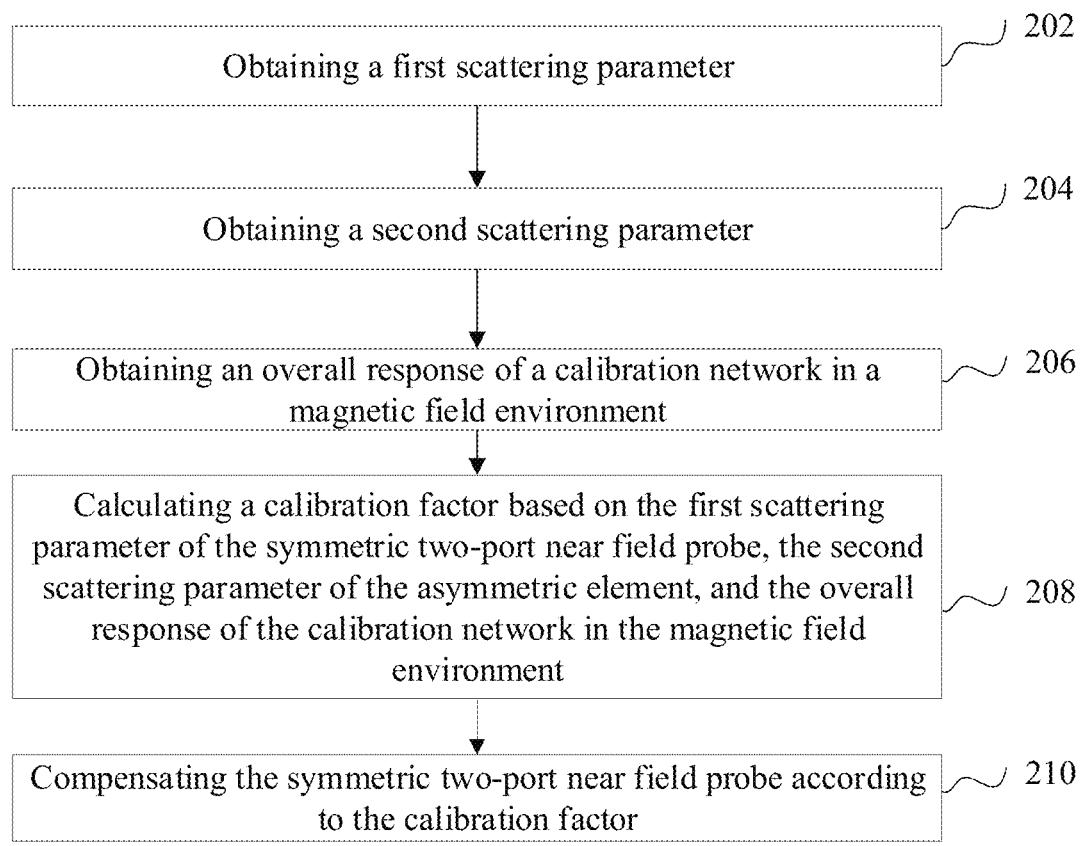
FIG. 2 is a schematic flowchart of an asymmetric compensation method for a two-port near field probe according to an embodiment.

In an embodiment, as shown in FIG. 2, an asymmetric compensation method for a two-port near field probe is provided. Taking the implementation with the terminal 102 as shown in FIG. 1 as an example, the method includes the following steps 202-210.

In step 202, a first scattering parameter of a symmetric two-port near field probe is obtained.

Figure 4:
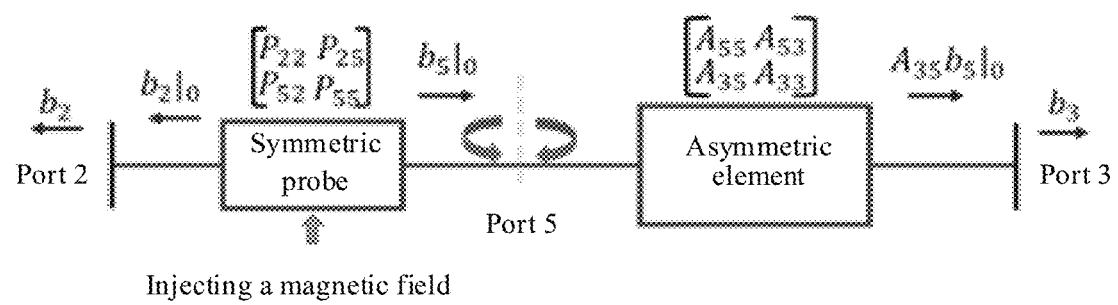
FIG. 4 is a schematic diagram showing a data transmission direction of a calibration network according to an embodiment.

The first scattering parameter is collected by a symmetric two-port network established based on the symmetric two-port near field probe. The symmetric two-port network includes the symmetric two-port near field probe and a vector network analyzer. The symmetric two-port near field probe includes a second port 2 and a fifth port 5 (as shown in FIG. 4). The vector network analyzer measures a S-parameter matrix $[P_{22}\ P_{25};\ P_{52}\ P_{55}]$, which is also referred to as a scattering parameter matrix, between the fifth port 5 and the second port 2 of the two-port near field probe. In this matrix, $P_{25}$ represents the first scattering parameter, which represents a reverse transmission coefficient, i.e., an isolation, of the fifth port 5 to the second port 2, $P_{52}$ represents a forward transmission coefficient, i.e., a gain, between the fifth port 5 and the second port 2, $P_{22}$ represents an input reflection coefficient, i.e., an input echo loss, between the fifth port 5 and the second port 2, and $P_{55}$ represents an output reflection coefficient, i.e., an output echo loss, between the fifth port 5 and the second port 2.

Specifically, the terminal obtains the scattering parameter matrix of the two-port near field probe, and extracts the reverse transmission coefficient of the fifth port 5 to the second port 2 from the scattering parameter matrix to obtain the first scattering parameter.

In step 204, a second scattering parameter of an asymmetric element is obtained.

The second scattering parameter is collected by an asymmetric two-port network established based on an asymmetric element. The asymmetric two-port network includes the asymmetric element and the vector network analyzer. A third port 3 is an output port of the asymmetric element. As shown in FIG. 4, an input port of the asymmetric element is connected to the fifth port 5 of the two-port near field probe. The vector network analyzer measures a S-parameter matrix $[A_{55}\ A_{53};\ A_{35}\ A_{33}]$, which is also referred to as a scattering parameter matrix, between the fifth port 5 of the two-port near field probe and the third port 3. In this matrix, $A_{35}$ represents the second scattering parameter, which represents a reverse transmission coefficient, i.e., an isolation, of the fifth port 5 to the third port 3, $A_{53}$ represents a forward transmission coefficient, i.e., a gain, between the fifth port 5 and the third port 3, $A_{33}$ represents an input reflection coefficient, i.e., an input echo loss, between the fifth port 5 and the third port 3, and $A_{55}$ represents an output reflection coefficient, i.e., an output echo loss, between the fifth port 5 and the third port 3. The asymmetric element may be any one of a cable, a connector, and an attenuator. The asymmetric element may also be other asymmetric elements, which is not limited in this embodiment.

Specifically, the terminal obtains the scattering parameter matrix of the asymmetric element, and extracts the reverse transmission coefficient of the fifth port 5 to the third port 3 from the scattering parameter matrix to obtain the second scattering parameter.

In step 206, an overall response of a calibration network in a magnetic field environment is obtained.

The calibration network is established based on the symmetric two-port near field probe and the asymmetric element. The calibration network is a system configured to perform asymmetric calibration on the symmetric two-port near field probe.

Figure 3:
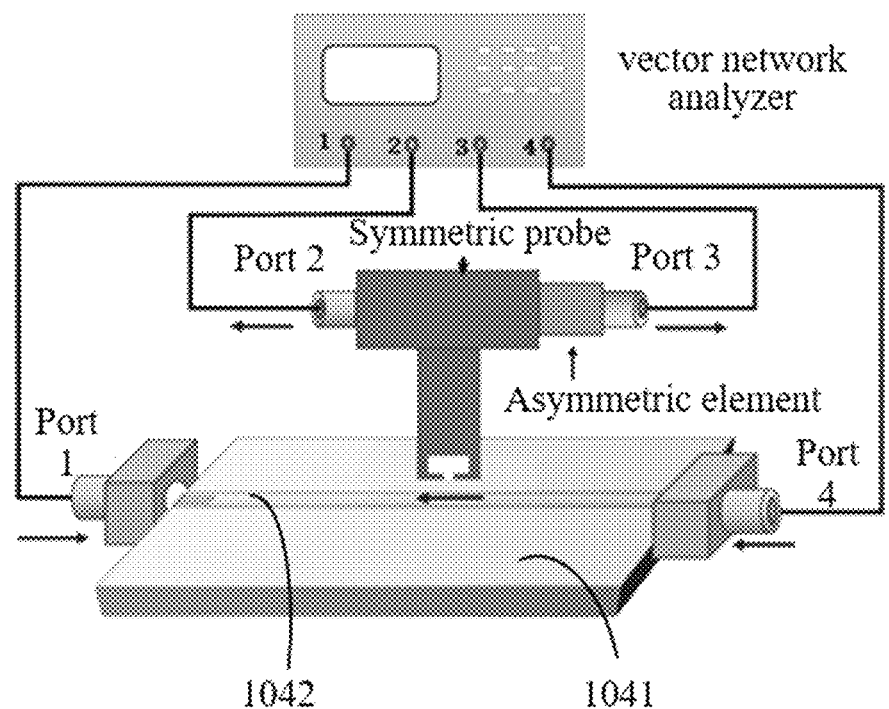
FIG. 3 is a schematic diagram showing a structure of a calibration network according to an embodiment.

In an optional embodiment, as shown in FIG. 3, the calibration network includes the vector network analyzer, the symmetric two-port near field probe, the asymmetric element, and a calibrator 1041. The vector network analyzer includes a first interface, a second interface, a third interface, and a fourth interface. A first port 1 and a fourth port 4 arranged at two sides of the calibrator are connected to the first interface and the fourth interface of the vector network analyzer, respectively. The second port 2 arranged at one side of the symmetric two-port near field probe is connected to the second interface of the vector network analyzer, and the fifth port 5 arranged at the other side of the symmetric two-port near field probe is connected to the asymmetric element. The third port 3 arranged at one side of the asymmetric element is connected to the third interface of the vector network analyzer, and the other port of the asymmetric element is connected to the symmetric two-port near field probe through the fifth port 5. The symmetric two-port near field probe is located on a preset track 1042 of the calibrator 1041.

The vector network analyzer (VNA) may also be replaced with an oscilloscope in other embodiments. The interfaces of the calibrator are SMA (SubMiniature version A) interfaces. Specifically, when the symmetric two-port near field probe is calibrated, the symmetric two-port near field probe needs to be disposed in a known near field. The near field may be a pure electric field environment, or may be a pure magnetic field environment. In this embodiment, a pure magnetic field environment is taken as an example. The calibrator is configured to measure the symmetric two-port near field probe. The first port 1 and the fourth port 4 that are connected to the calibrator are used to receive an input signal from the vector network analyzer. The input signal may be a radio frequency signal generated when the symmetric two-port near field probe is excited by the current near field. The second interface and the third interface of the vector network analyzer are configured to receive signals, i.e., receive a signal returned by the second port 2 of the symmetric two-port near field probe and a signal returned by the port 3 of the asymmetric element, respectively.

Specifically, the vector network analyzer applies an electromagnetic near field to the symmetric two-port near field probe. In other words, the vector network analyzer outputs the signal a1 through the first interface, and then obtains radio frequency signals generated by the symmetric two-port near field probe and the asymmetric element under the near field excitation, i.e., obtains an overall response of the second port 2 and the third port 3 so as to obtain an overall response of the calibration network in the magnetic field environment. The overall response of the calibration network in the magnetic field environment includes an overall response b2 of the second port 2 and an overall response b3 of the third port 3. The overall response b2 of the second port 2 and the overall response b3 of the third port 3 can be measured by the vector network analyzer. Then, the terminal obtains the overall response b2 of the port 2 and the overall response b3 of the port 3 to obtain the overall response of the calibration network in the magnetic field environment.

In step 208, a calibration factor is calculated based on the first scattering parameter of the symmetric two-port near field probe, the second scattering parameter of the asymmetric element, and the overall response of the calibration network in the magnetic field environment.

Specifically, since the input signal a1 passes through the transmission line on which the symmetric two-port near field probe and the asymmetric element are located, an abrupt change occurs in the impedance between the symmetric two-port near field probe and the asymmetric element, and the signal is reflected and refracted. Therefore, the overall response of the calibration network in the magnetic field environment includes the response of the symmetric two-port near field probe and the effect of multiple signals such as the scattering parameter of the symmetric two-port near field probe and the scattering parameter of the asymmetric element. The terminal performs modeling based on a signal graph stream in the calibration network and the scattering parameters to obtain a preset calibration expression, and calculates the calibration factor according to the first scattering parameter of the symmetric two-port near field probe, the second scattering parameter of the asymmetric element, the overall response of the calibration network in the magnetic field environment, and the preset calibration expression.

In step 210, the symmetric two-port near field probe is compensated according to the calibration factor.

Specifically, the terminal transmits the calibration factor to the calibration network, so that the calibration network compensates the symmetric two-port near field probe, solving the asymmetric problem and ensuring the obtaining of more accurate positioning information and weak electromagnetic signals.

In the foregoing asymmetric compensation method for a two-port near field probe, the first scattering parameter, which is collected by the symmetric two-port network established based on the symmetric two-port near field probe, is obtained. The second scattering parameter, which is collected by the asymmetric two-port network established based on the asymmetric element, is obtained. The overall response of the calibration network in the magnetic field environment is obtained. The calibration network is established based on the symmetric two-port near field probe and the asymmetric element. The calibration factor is calculated according to the scattering parameter of the symmetric two-port near field probe, the scattering parameter of the asymmetric element, and the overall response of the calibration network in the magnetic field environment. The symmetric two-port near field probe is compensated based on the calibration factor. In the whole solution, the first scattering parameter of the symmetric two-port near field probe and the second scattering parameter of the asymmetric element are first obtained, respectively. Then, in the calibration network, the overall response of the calibration network in the magnetic field environment is obtained, and thus the calibration factor in the calibration network is calculated based on the first scattering parameter, the second scattering parameter, and the overall response of the calibration network in the magnetic field environment. The symmetric two-port near field probe is compensated according to the calibration factor, so as to resolve the asymmetric problem and improve measurement accuracy of the asymmetric system.

In an optional embodiment, calculating the calibration factor based on the first scattering parameter of the symmetric two-port near field probe, the second scattering parameter of an asymmetric element, and the overall response of the calibration network in the magnetic field environment includes:

performing a calculation based on the first scattering parameter of the symmetric two-port near field probe, the second scattering parameter of the asymmetric element, and the overall response of the calibration network in the magnetic field environment to obtain a response of the symmetric two-port near field probe in the magnetic field environment; and determining the calibration factor based on the response of the symmetric two-port near field probe in the magnetic field environment.

The response of the symmetric two-port near field probe in the magnetic field environment is a zero-order response of the two-port near field probe. The zero-order response of the two-port near field probe includes the zero-order response of the second port 2 of the two-port near field probe and the zero-order response of the fifth port 5 of the two-port near field probe.

Specifically, the terminal calculates the zero-order response of the symmetric two-port near field probe in the magnetic field environment based on the signal graph stream in the calibration network, the first scattering parameter of the symmetric two-port near field probe, the second scattering parameter of the asymmetric element, and the overall response of the calibration network in the magnetic field environment. Then, the terminal calculates the calibration factor based on the response of the symmetric two-port near field probe in the magnetic field environment and the preset calibration expression.

In this embodiment, based on the signal graph stream in the calibration network, the transmission paths of the signals at two ends of the probe can be accurately determined, so that the response of the symmetric two-port near field probe in the magnetic field environment can be accurately calculated. Then, the calibration factor is calculated based on the accurate response of the symmetric two-port near field probe in the magnetic field environment, so that the obtained calibration factor is more accurate.

In an optional embodiment, performing the calculation based on the first scattering parameter of the symmetric two-port near field probe, the second scattering parameter of the asymmetric element, and the overall response of the calibration network in the magnetic field environment to obtain the response of the symmetric two-port near field probe in the magnetic field environment includes:

constructing a first transmission equation based on a first transmission link of the calibration network;

constructing a second transmission equation based on a second transmission link of the calibration network; and determining the response of the symmetric two-port near field probe in the magnetic field environment based on the first scattering parameter of the symmetric two-port near field probe, the second scattering parameter of the asymmetric element, the first transmission equation, and the second transmission equation.

The first transmission link and the second transmission link are transmission links of the symmetric two-port near field probe in two opposite directions. The transmission link formed by the fifth port 5 and the second port 2 of the symmetric two-port near field probe and the second interface of the vector network analyzer is the first transmission link. The transmission link formed by the fifth port 5 of the symmetric two-port near field probe, the third port 3 of the asymmetric element, and the third interface of the vector network analyzer is the second transmission link.

The fifth port 5 is obscured by the asymmetric element, and signals are reflected and refracted at the fifth port 5.

Specifically, the first transmission equation represents the specific composition of the overall response b2 of the second port 2 of the symmetric two-port near field probe in the magnetic field environment, including a superposition of the zero-order response of the second port 2 of the symmetric two-port near field probe in the magnetic field environment and a first response signal. The first response signal represents a superposition of a signal reflected by the fifth port 5 and the zero-order response of the fifth port 5. Specifically, the first response signal is a product of the zero-order response of the fifth port 5 of the symmetric two-port near field probe in the magnetic field environment, the reverse transmission coefficient of the fifth port 5 to the second port 2, and a first preset characteristic parameter. The terminal constructs the first transmission equation based on the signal graph stream of the first transmission link of the calibration network. The first transmission equation is shown in the following formula (1):

$$b_2 = b_{210} + b_{510} P_{25} M \tag{1}$$

where $b_2$ represents the overall response of the second port 2 of the symmetric two-port near field probe in the magnetic field environment, $b_{210}$ represents the zero-order response of the second port 2 of the symmetric two-port near field probe in the magnetic field environment, $b_{510} P_{25} M$ represents the first response signal, $b_{510}$ represents the zero-order response of the fifth port 5 of the symmetric two-port near field probe in the magnetic field environment, and M represents the preset first characteristic parameter. A specific expression of M is as follows:

$$M = \sum_{n=1}^{\infty} A_{55}^n P_{55}^{n-1} \tag{2}$$

where $A^n$, represents the output reflection coefficient of the fifth port 5 to the third port 3 after the n-th reflection, and $P_{55}^{n-1}$ represents the output reflection coefficient between the fifth port 5 and the second port 2 after the (n−1)-th reflection.

The second transmission equation represents the specific composition of the overall response b3 of the third port 3 of the asymmetric element in the magnetic field environment, including a second response signal. The second response signal represents a superposition of a signal reflected by the fifth port 5 and the zero-order response of the fifth port 5. Specifically, the second response signal is a product of the zero-order response of the fifth port 5 of the symmetric two-port near field probe in the magnetic field environment, the reverse transmission coefficient of the fifth port 5 to the third port 3, and a preset second characteristic parameter. The terminal constructs the second transmission equation based on the signal graph stream of the first transmission link of the calibration network. The second transmission equation is shown in the following formula (3):

$$b_3 = b_{510} A_{35} N \tag{3}$$

where $b_3$ represents the overall response of the third port 3 of the asymmetric element in the magnetic field environment, and N represents the preset second characteristic parameter. A specific expression of N is as follows:

$$N = 1 + \sum_{n=1}^{\infty} A_{55}^n P_{55}^n \tag{4}$$

where $P_{55}^n$ represents the output reflection coefficient between the fifth port 5 and the second port 2 after the n-th reflection.

In an optional embodiment, determining the response of the symmetric two-port near field probe in the magnetic field environment based on the first scattering parameter of the symmetric two-port near field probe, the second scattering parameter of the asymmetric element, the first transmission equation, and the second transmission equation includes:

transforming the first transmission equation and the second transmission equation to obtain a first response expression of the symmetric two-port near field probe in the magnetic field environment and a second response expression of the symmetric two-port near field probe in the magnetic field environment, respectively;

calculating a first response of the symmetric two-port near field probe in the magnetic field environment based on the overall response of the calibration network in the magnetic field environment, the first scattering parameter of the symmetric two-port near field probe, the second scattering parameter of the asymmetric element, a preset characteristic parameter, and the first response expression; and extracting an overall response of the second transmission link from the overall response of the calibration network in the magnetic field environment, and calculating a second response of the symmetric two-port near field probe in the magnetic field environment based on the overall response of the second transmission link, the second scattering parameter of the asymmetric element, the preset characteristic parameters, and the second response expression.

The first response expression of the symmetric two-port near field probe represents the expression of the zero-order response of the second port 2, and the second response expression of the symmetric two-port near field probe represents the expression of the zero-order response of the fifth port 5 in the magnetic field environment. The preset characteristic parameters include the preset first characteristic parameter M and the preset second characteristic parameter N.

Specifically, the terminal performs a formal transformation on the second transmission equation to obtain the expression of the zero-order response $b_5|_0$ of the fifth port 5 of the symmetric two-port near field probe in the magnetic field environment, as shown in formula (5):

$$b_5|_0 = \frac{b_3}{A_{35}N} \tag{5}$$

Then, the second response expression is substituted into the first transmission equation (i.e., the formula (1)), and a formal transformation is performed on the first transmission equation to obtain the expression of the zero-order response $b_2|_0$ of the second port 2 of the symmetric two-port near field probe in the magnetic field environment, as shown in formula (6):

$$b_2|_0 = b_2 - \frac{b_3 P_{35} M}{A_{35} N} \tag{6}$$

A process of determining the second characteristic parameter M and the preset second characteristic parameter N is as follows:

Since $b_{3|0} = A_{35} b_{5|0}$, after the input signal is reflected for the first time, the first-order responses of the fifth port 5, the second port 2, and the third port 3 are represented as follows, respectively:

$$b_5|_1 = b_5|_0 A_{55}$$

$$b_2|_1 = b_5|_0 A_{55} P_{25}$$

$$b_3|_1 = b_5|_0 A_{55} P_{55} A_{35}$$

where $b_{5|1}$ represents the first-order response of the fifth port 5 of the symmetric two-port near field probe in the magnetic field environment, $b_{2|1}$ represents the first-order response of the second port 2 of the symmetric two-port near field probe in the magnetic field environment, and $b_{3|1}$ represents the first-order response of the third port 3 of the asymmetric element in the magnetic field environment.

After the input signal is reflected for the second time, the second-order response of the fifth port 5, the second port 2, and the third port 3 are represented as follows, respectively:

$$b_5|_2 = b_5|_0 A_{55}^2 P_{55}$$

$$b_2|_2 = b_5|_0 A_{55}^2 P_{55} P_{25}$$

$$b_3|_2 = b_5|_0 A_{55}^2 P_{55}^2 A_{35}$$

where $b_{5|2}$ represents the second-order response of the fifth port 5 of the symmetric two-port near field probe in the magnetic field environment, $b_{2|2}$ represents the second-order response of the second port 2 of the symmetric two-port near field probe in the magnetic field environment, $b_{3|2}$ represents the second-order response of the third port 3 of the asymmetric element in the magnetic field environment, $A_{55}^2$ represents the output reflection coefficient of the fifth port 5 to the third port 3 after the second reflection, and $P_{55}^2$ represents the output reflection coefficient between the fifth port 5 and the second port 2 after the second reflection.

Similarly, after the input signal is reflected for the n-th time, the n-th order response of the fifth port 5, the second port 2, and the third port 3 are represented as follows, respectively:

$$b_5|_n = b_5|_0 A_{55}^n P_{55}$$

$$b_2|_n = b_5|_0 A_{55}^n P_{55}^{n-1} P_{25}$$

$$b_3|_n = b_5|_0 A_{55}^n P_{55}^n A_{35}$$

where $b_{5_{1n}}$ represents the (n-th)-order response of the fifth port 5 of the symmetric two-port near field probe in the magnetic field environment, $b_{2_{1n}}$ represents the (n-th)-order response of the second port 2 of the symmetric two-port near field probe in the magnetic field environment, and $b_{3_{1n}}$ represents the (n-th)-order response of the third port 3 of the asymmetric element in the magnetic field environment. $A_{55}{}^n$ represents the output reflection coefficient of the fifth port 5 to the third port 3 after the n-th reflection, $P_{55}{}^n$ represents the output reflection coefficient between the fifth port 5 and the second port 2 after the n-th reflection, and $P_3$-1 represents the output reflection coefficient between the fifth port 5 and the second port 2 after the (n−1)-th reflection.

Therefore, a definition of the preset first characteristic parameter M and a definition of the preset second characteristic parameter N can be obtained by extracting the common portion of the above response expressions, such that the first transmission equation of the overall response b2 of the second port 2 of the symmetric two-port near field probe in the magnetic field environment and the second transmission equation of the overall response b3 of the third port 3 of the asymmetric element in the magnetic field environment are obtained.

In an optional embodiment, determining the calibration factor based on the response of the symmetric two-port near field probe in the magnetic field environment includes:
determining an output voltage of the calibration network based on the response of the symmetric two-port near field probe in the magnetic field environment and a preset voltage expression;
obtaining a magnetic field signal; and
obtaining the calibration factor based on the magnetic field signal and the output voltage.

The preset voltage expression is obtained by dividing the difference between the first response of the symmetric two-port near field probe and the second response of the symmetric two-port near field probe by a preset voltage coefficient. The preset voltage coefficient may be $\sqrt{2}$.

Specifically, the preset voltage expression is shown in formula (7):

$$V_0 = \frac{b_2|_0 - b_5|_0}{\sqrt{2}} \qquad (7)$$

The following formula (8) can be obtained by expanding the preset voltage expression:

$$V_0 = \frac{b_2 A_{35} N - b_3 (P_{25} M + 1)}{A_{35} N \sqrt{2}} \qquad (8)$$

The terminal inputs the zero-order response of the second port 2 and the zero-order response of the fifth port 5 into the preset voltage expression to calculate the output voltage of the calibration network. The magnetic field signal is obtained, and then the magnetic field signal and the output voltage are input to the preset calibration expression to obtain the calibration factor.

In an optional embodiment, obtaining the calibration factor based on the magnetic field signal and the output voltage includes:
multiplying the logarithm of the magnetic field signal by a preset multiplier to obtain a magnetic field product;

dividing the output voltage by an input signal to obtain a signal divisor, and determining an absolute value of the signal divisor; and
calculating a difference between the magnetic field product and the absolute value of the signal divisor to obtain the calibration factor.

Specifically, the preset calibration expression is shown in formula (9) as follows:

$$|CF| = \left|\frac{H}{V_0}\right| = 20\log_{10}(\gamma m) - \left|\frac{V_0}{\alpha_1}\right| \qquad (9)$$

where H represents a magnetic field, and γm represents a magnetic field of the calibrator excited by a unit current and can be obtained by means of simulation. $\alpha_1$ represents an input signal of the first port 1, $V_0$ represents an output voltage. Based on the preset calibration expression, the common logarithm of the magnetic field signal is multiplied by the preset multiplier to obtain the magnetic field product, the output voltage is divided by the input signal to obtain the signal divisor, and the absolute value of the signal divisor is obtained. The difference between the magnetic field product and the absolute value of the signal divisor is determined to obtain the absolute value |CF| of the calibration factor.

Figure 5:
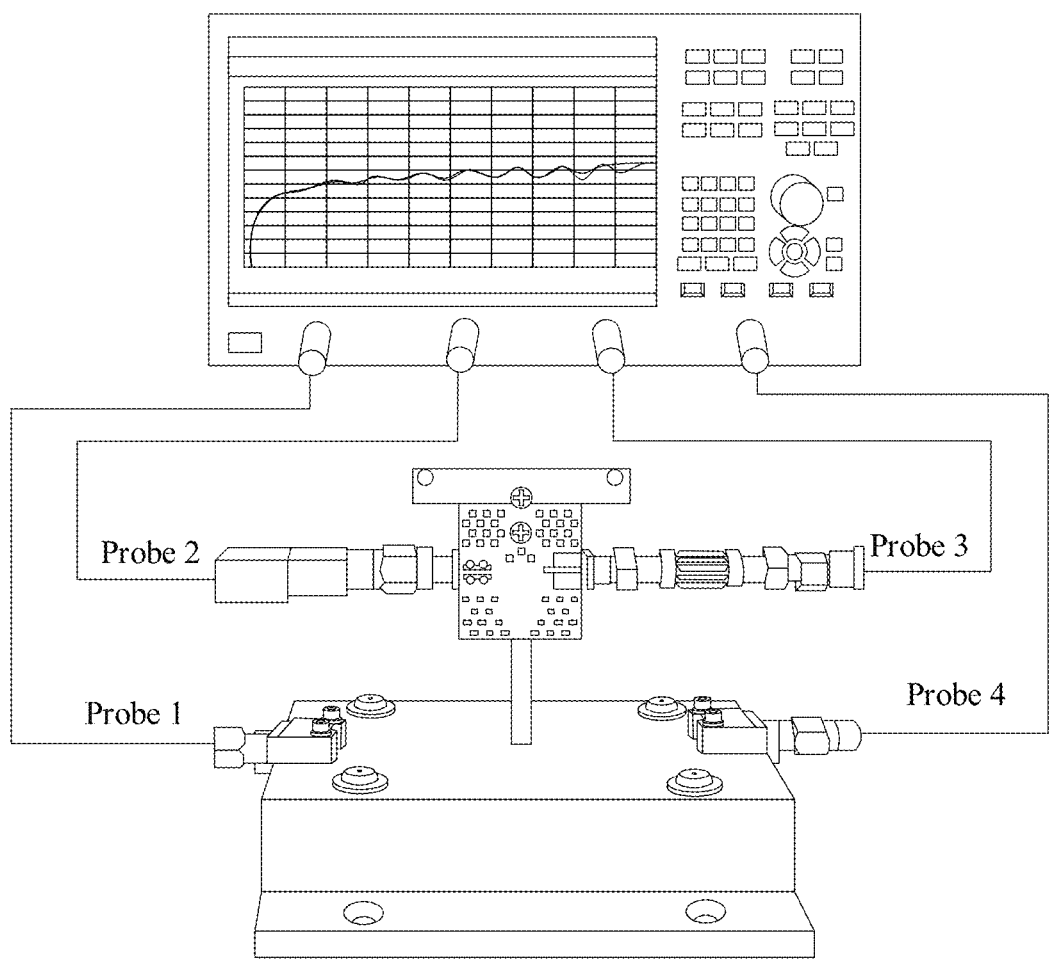
FIG. 5 is a schematic diagram showing a verification of applying an asymmetric compensation method for a two-port near field probe of the present disclosure according to an embodiment.
Figure 6:
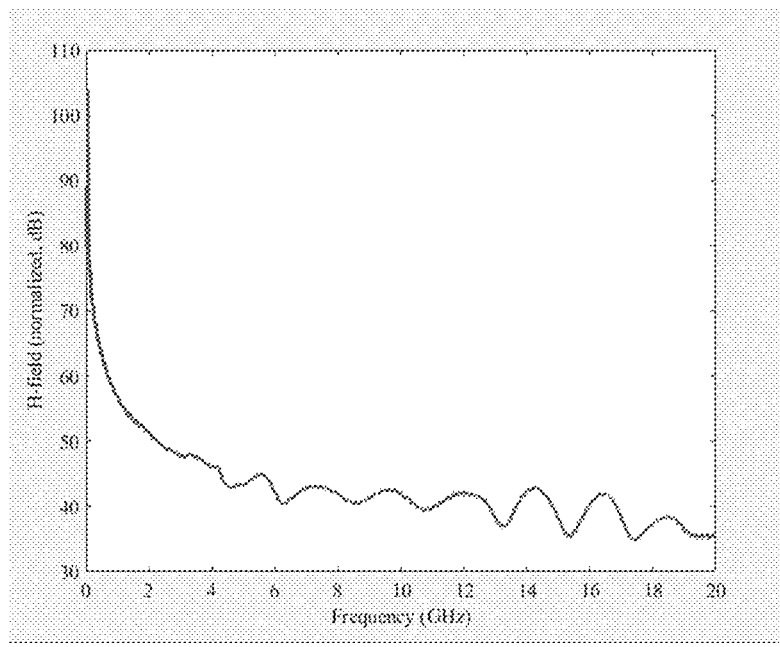
FIG. 6 is a schematic diagram showing a result of applying an asymmetric compensation method for a two-port near field probe of the present disclosure according to an embodiment.

As shown in FIG. 5, the asymmetric compensation method for a two-port near field probe provided in this application is verified, and an obtained result diagram is shown in FIG. 6. The horizontal axis Frequency indicates frequencies, and the vertical axis H-field indicates the normalized magnetic field signals. The calibrated two-port near field probe can measure the magnetic field signal strength in the near field and can measure weaker electromagnetic signals, suitable for a wider frequency range.

Figure 7:
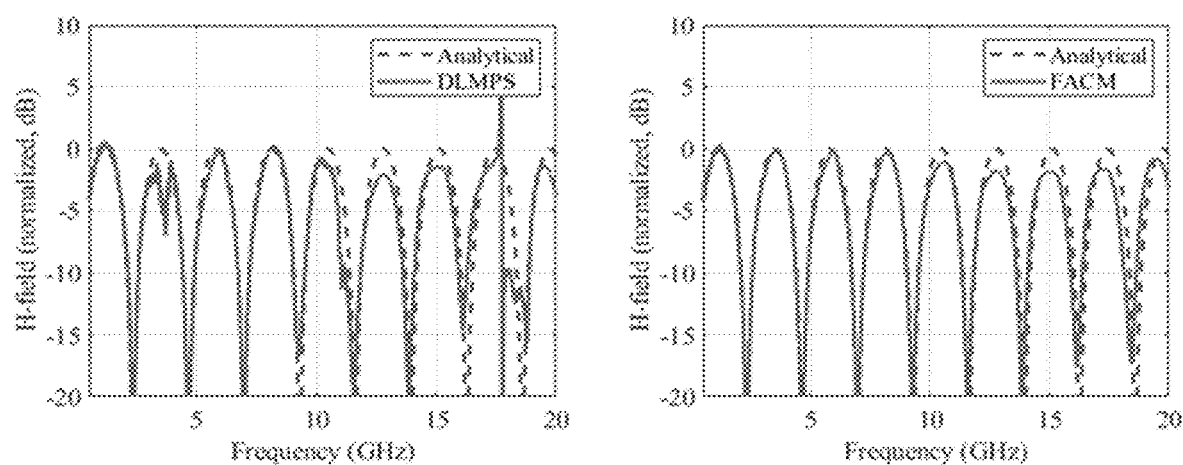
FIG. 7 is a result comparison diagram of applying an asymmetric compensation method for a two-port near field probe of the present disclosure according to an embodiment.

Then, a connector, an attenuator, a cable, and the like are respectively used as asymmetric elements for verification. As shown in FIG. 7, a connector is connected in series in a transmission link of a symmetric two-port near field probe, and a calibration factor is determined. An asymmetric compensation is performed on the two-port near field probe, and the magnetic field signal strength in the near field is measured using the calibrated two-port near field probe. Then, a conventional compensation method is compared to the asymmetric compensation method for a two-port near field probe provided in the present disclosure. In FIG. 7, Analytical represents a theoretical calculation value, and a specific calculation expression is as follows:

$$H_{norm} = \left|\sin(\sqrt{LC}\,x\cdot\omega)\right| \qquad (10)$$

where Hnorm represents a normalized standing wave magnetic field along the transmission line, x represents a distance between an open point and a measurement point, L represents an inductance of a unit length, C represents a capacitance of the unit length, and @ is an angular frequency.

DLMPS represents a measurement value obtained by a conventional compensation method, and FACM represents a measurement value obtained by the asymmetric compensation method for a two-port near field probe provided in the present disclosure. As can be seen from FIG. 7, the measurement result obtained by using the asymmetric compensation method for a two-port near field probe provided in the present disclosure is closer to the theoretical calculation value, and therefore, the asymmetric compensation is more accurate.

Figure 8:
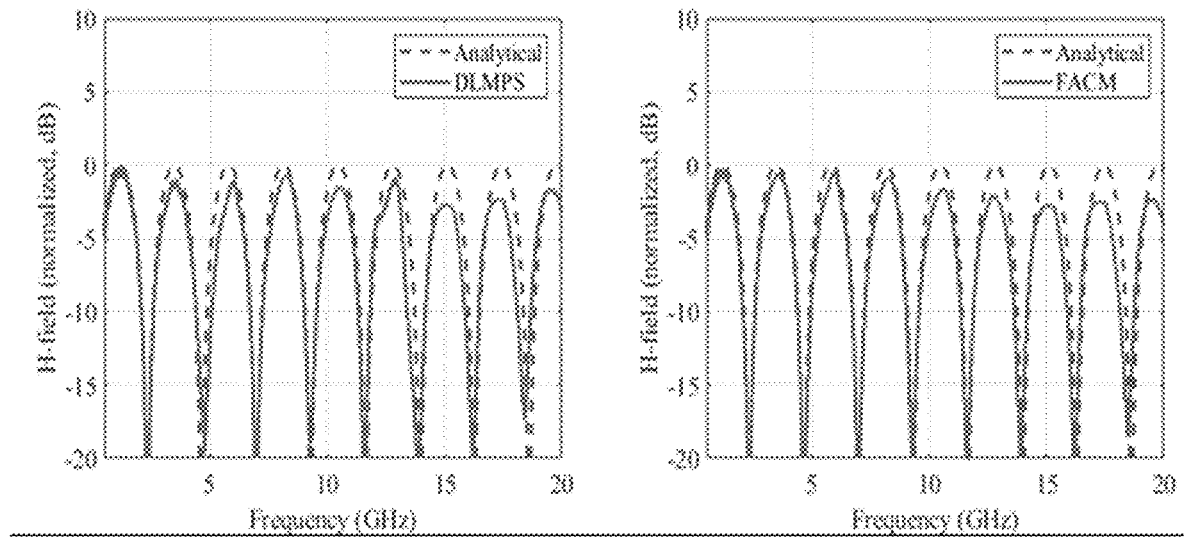
FIG. 8 is a result comparison diagram of applying an asymmetric compensation method for a two-port near field probe of the present disclosure according to another embodiment.

As shown in FIG. 8, a cable is connected in series in a transmission link of a symmetric two-port near field probe, and a calibration factor is determined. An asymmetric compensation is performed on the two-port near field probe, and the magnetic field signal strength in the near field is measured using the calibrated two-port near field probe. Then, a conventional compensation method is compared to the asymmetric compensation method for a two-port near field probe provided in the present disclosure. As can be seen from FIG. 8, both the measurement results obtained by using the asymmetric compensation method for a two-port near field probe provided in the present disclosure and the conventional compensation method are close to the theoretical calculation value.

Figure 9:
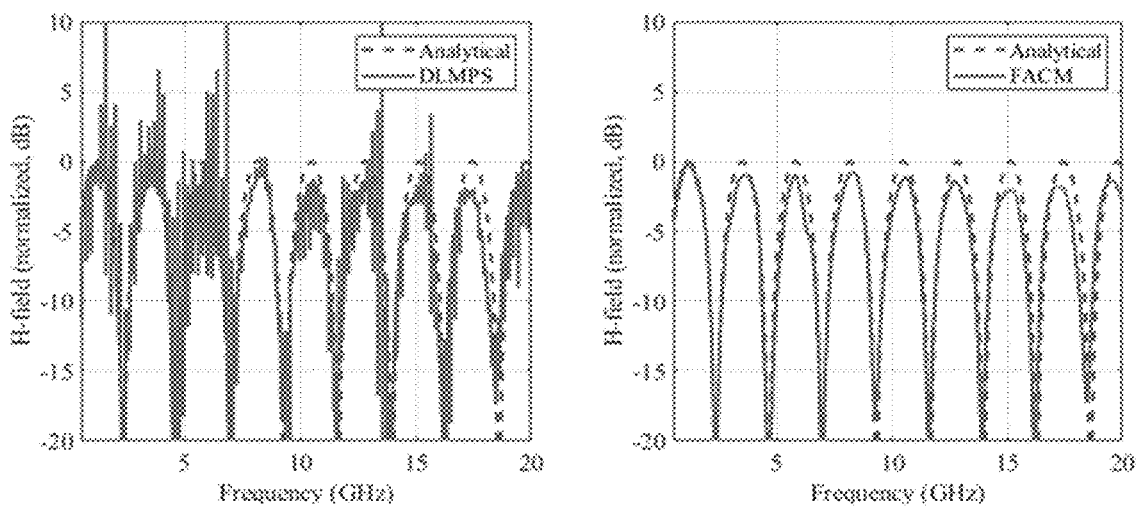
FIG. 9 is a result comparison diagram of applying an asymmetric compensation method for a two-port near field probe of the present disclosure according to yet another embodiment.

As shown in FIG. 9, an attenuator is connected in series in a transmission link of a symmetric two-port near field probe, and a calibration factor is determined. An asymmetric compensation is performed on the two-port near field probe, and the magnetic field signal strength of in the near field is measured using the calibrated two-port near field probe. Then, the conventional compensation method is compared to the asymmetric compensation method for a two-port near field probe provided in the present disclosure. As can be seen from FIG. 9, the measurement result obtained by using the asymmetric compensation method for a two-port near field probe provided in the present disclosure is closer to the theoretical calculation value, and therefore, the asymmetric compensation is more accurate.

In summary, after the near field probe is calibrated by using the asymmetric compensation method for a two-port near-field probe provided in the foregoing embodiments, the measurement of the characteristic parameters of the near field is more accurate. Compared to conventional methods, it has a stronger bandwidth, which is verified to be able to reach up to 20 GHz.

Figure 10:
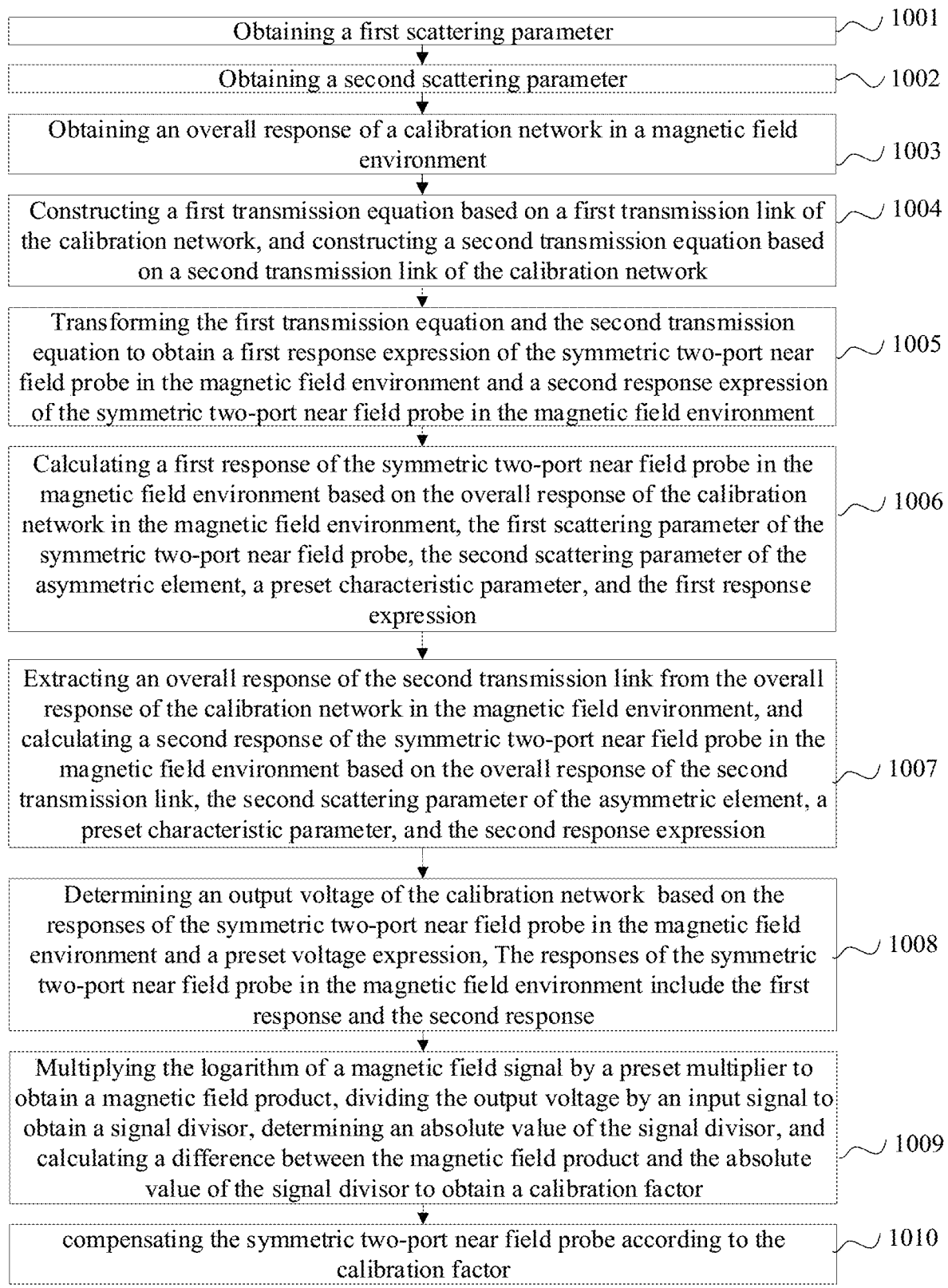
FIG. 10 is a schematic flowchart of an asymmetric compensation method for a two-port near field probe according to another embodiment.

To facilitate understanding of the technical solutions provided in the embodiments of the present disclosure, as shown in FIG. 10, the asymmetric compensation method for a two-port near field probe provided in the embodiments of the present disclosure is briefly illustrated with a complete process of the asymmetric compensation for a two-port near field probe.

In step 1001, a first scattering parameter of a symmetric two-port near field probe is obtained.

In step 1002, a second scattering parameter of an asymmetric element is obtained.

In step 1003, an overall response of a calibration network in a magnetic field environment is obtained.

In step 1004, a first transmission equation is constructed based on a first transmission link of the calibration network, and a second transmission equation is constructed based on a second transmission link of the calibration network.

In step 1005, a first response expression of the symmetric two-port near field probe in the magnetic field environment and a second response expression of the symmetric two-port near field probe in the magnetic field environment are obtained by transforming the first transmission equation and the second transmission equation.

In step 1006, a first response of the symmetric two-port near field probe in the magnetic field environment is calculated based on the overall response of the calibration network in the magnetic field environment, the first scattering parameter of the symmetric two-port near field probe, the second scattering parameter of the asymmetric element, a preset characteristic parameter, and the first response expression.

In step 1007, an overall response of the second transmission link is extracted from the overall response of the calibration network in the magnetic field environment, and a second response of the symmetric two-port near field probe in the magnetic field environment is calculated based on the overall response of the second transmission link, the second scattering parameter of the asymmetric element, a preset characteristic parameter, and the second response expression.

In step 1008, an output voltage of the calibration network is determined based on the responses of the symmetric two-port near field probe in the magnetic field environment and a preset voltage expression. The responses of the symmetric two-port near field probe in the magnetic field environment include the first response and the second response.

In step 1009, a magnetic field product is obtained by multiplying the logarithm of a magnetic field signal by a preset multiplier, a signal divisor is obtained by dividing the output voltage by an input signal, and an absolute value of the signal divisor is determined, and a difference between the magnetic field product and the absolute value of the signal divisor is calculated to obtain a calibration factor.

In step 1010, the symmetric two-port near field probe is compensated according to the calibration factor.

It should be understood that, although the steps in the flowcharts involved in the above embodiments are sequentially shown by the indications of the arrows, these steps are not necessarily executed in the order indicated by the arrows. Unless explicitly stated herein, the execution of these steps is not strictly limited to the order, and the steps may be executed in other orders. Moreover, at least a part of the steps in the flowcharts involved in the above embodiments may include multiple steps or multiple stages, and these steps or stages are not necessarily executed and completed at the same time, but may be performed at different times. The execution order of these steps or stages is not necessarily sequential, but may be performed alternately or in turn with other steps or at least a part of the steps or stages of the other steps.

Based on the same inventive concept, the embodiments of the present disclosure also provide an asymmetric compensation apparatus for a two-port near-field probe for implementing the foregoing asymmetric compensation method for a two-port near-field probe. The solution for solving the problem provided by the apparatus is similar to the solution described in the foregoing method. Therefore, specific limitations in one of more embodiments of the asymmetric compensation apparatus for a two-port near field probe below can be seen in the foregoing definition of the asymmetric compensation method for a two-port near field probe, which is not described herein again.

Figure 11:
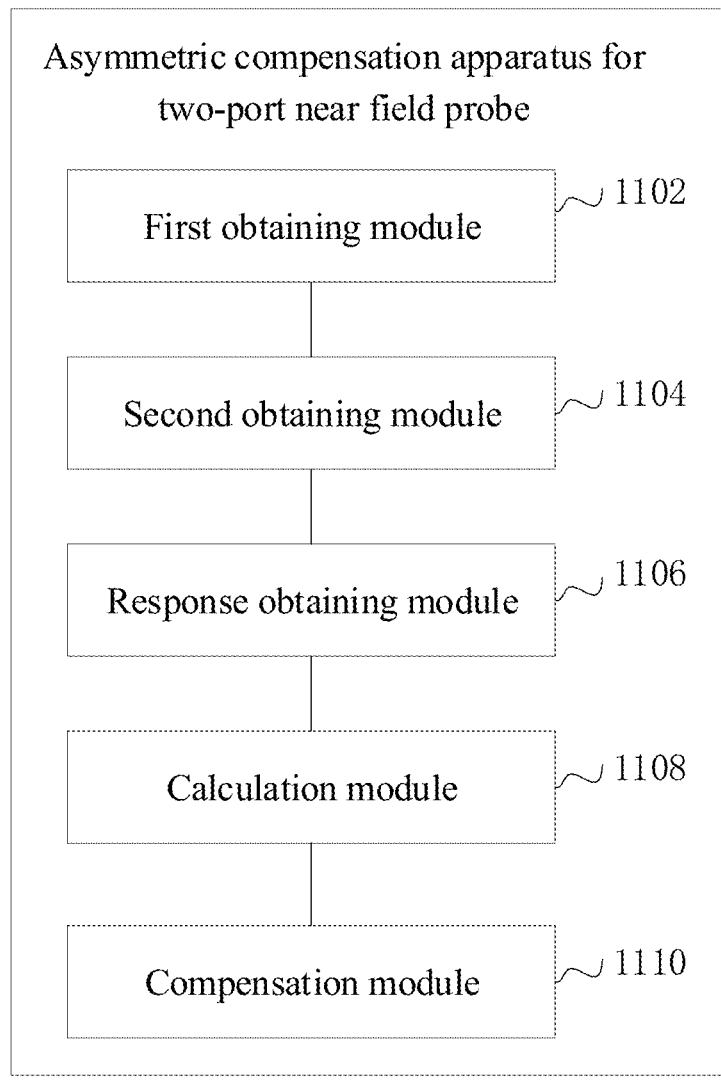
FIG. 11 is a block diagram of a structure of an asymmetric compensation apparatus for a two-port near field probe according to an embodiment.

In an embodiment, as shown in FIG. 11, an asymmetric compensation apparatus for a two-port near field probe is provided, including a first obtaining module 1102, a second obtaining module 1104, a response obtaining module 1106, a calculation module 1108, and a compensation module 1110.

The first obtaining module 1102 is configured to obtain a first scattering parameter of a symmetric two-port near field probe. The first scattering parameter is collected by a symmetric two-port network established based on a symmetric two-port near field probe.

The second obtaining module 1104 is configured to obtain a second scattering parameter of an asymmetric element. The second scattering parameter is collected by an asymmetric two-port network established based on an asymmetric element.

The response obtaining module 1106 is configured to obtain an overall response of a calibration network in a magnetic field environment. The calibration network is established based on the symmetric two-port near field probe and the asymmetric element;

The calculation module 1108 is configured to determine a calibration factor by means of calculation based on the first scattering parameter of the symmetric two-port near field probe, the second scattering parameter of the asymmetric element, and the overall response of the calibration network in the magnetic field environment.

The compensation module 1110 is configured to compensate the symmetric two-port near field probe based on the calibration factor.

In an embodiment, the calculation module 1108 is further configured to obtain a response of the symmetric two-port near field probe in the magnetic field environment by performing calculation based on the first scattering parameter of the symmetric two-port near field probe, the second scattering parameter of the asymmetric element, and the overall response of the calibrated network in the magnetic field environment, and determine a calibration factor based on the response of the symmetric two-port near field probe in the magnetic field environment.

In an embodiment, the calculation module 1108 is further configured to construct a first transmission equation based on a first transmission link of the calibration network, and construct a second transmission equation based on a second transmission link of the calibrated network. The first transmission link and the second transmission link are transmission links of the symmetrical two-port near field probe in two opposite directions. The calculation module 1108 further determines the response of the symmetric two-port near field probe in the magnetic field environment based on the first scattering parameter of the symmetric two-port near field probe, the second scattering parameter of the asymmetric element, the first transmission equation, and the second transmission equation.

In an embodiment, the calculation module 1108 is further configured to transform the first transmission equation and the second transmission equation, respectively, to obtain a first response expression of the symmetric two-port near field probe in the magnetic field environment and a second response expression of the symmetric two-port near field probe in the magnetic field environment, and obtain a first response of the symmetric two-port near field probe in the magnetic field environment by performing calculation based on the overall response of the calibration network in the magnetic field environment, the first scattering parameter of the symmetric two-port near field probe, the second scattering parameter of the asymmetric element, a preset characteristic parameter, and the first response expression. The calculation module 1108 extracts an overall response of the second transmission link from the overall response of the calibration network in the magnetic field environment and obtains a second response of the symmetric two-port near field probe in the magnetic field environment by performing calculation based on the overall response of the second transmission link, the second scattering parameter of the asymmetric element, a preset characteristic parameter, and the second response expression.

In an embodiment, the calculation module 1108 is further configured to determine an output voltage of the calibration network based on the response of the symmetric two-port near field probe in the magnetic field environment and a preset voltage expression, obtain a magnetic field signal, and obtain the calibration factor based on the magnetic field signal and the output voltage.

In an embodiment, the calculation module 1108 is further configured to multiply the logarithm of a magnetic field signal by a preset multiplier to obtain a magnetic field product, divide the output voltage by an input signal to obtain a signal divisor, determine an absolute value of the signal divisor, and calculate a difference between the magnetic field product and the absolute value of the signal divisor to obtain the calibration factor.

In an embodiment, the calibration network includes a vector network analyzer, the symmetric two-port near field probe, the asymmetric element, and a calibrator. The vector network analyzer includes a first interface, a second interface, a third interface, and a fourth interface. A first port 1 and a fourth port 4 arranged at two sides of the calibrator are respectively connected to the first interface and the fourth interface of the vector network analyzer. A second port 2 arranged at one side of the symmetric two-port near field probe is connected to the second interface of the vector network analyzer, and a fifth port 5 arranged at the other side of the symmetric two-port near field probe is connected to the asymmetric element. A third port 3 arranged at one side of the asymmetric element is connected to a third interface of the vector network analyzer, and the other port of the asymmetric element is connected to the symmetric two-port near field probe. The symmetric two-port near field probe is located on a preset track of the calibrator.

The modules in the foregoing asymmetric compensation apparatus for a two-port near field probe may be implemented in whole or in part by software, hardware, and a combination thereof. Each of the foregoing modules may be embedded in or independent of a processor in a computer device in a form of hardware, or may be stored in a memory in the computer device in a form of software, so as to be called by the processor to perform the operations corresponding to the foregoing modules.

Figure 12:
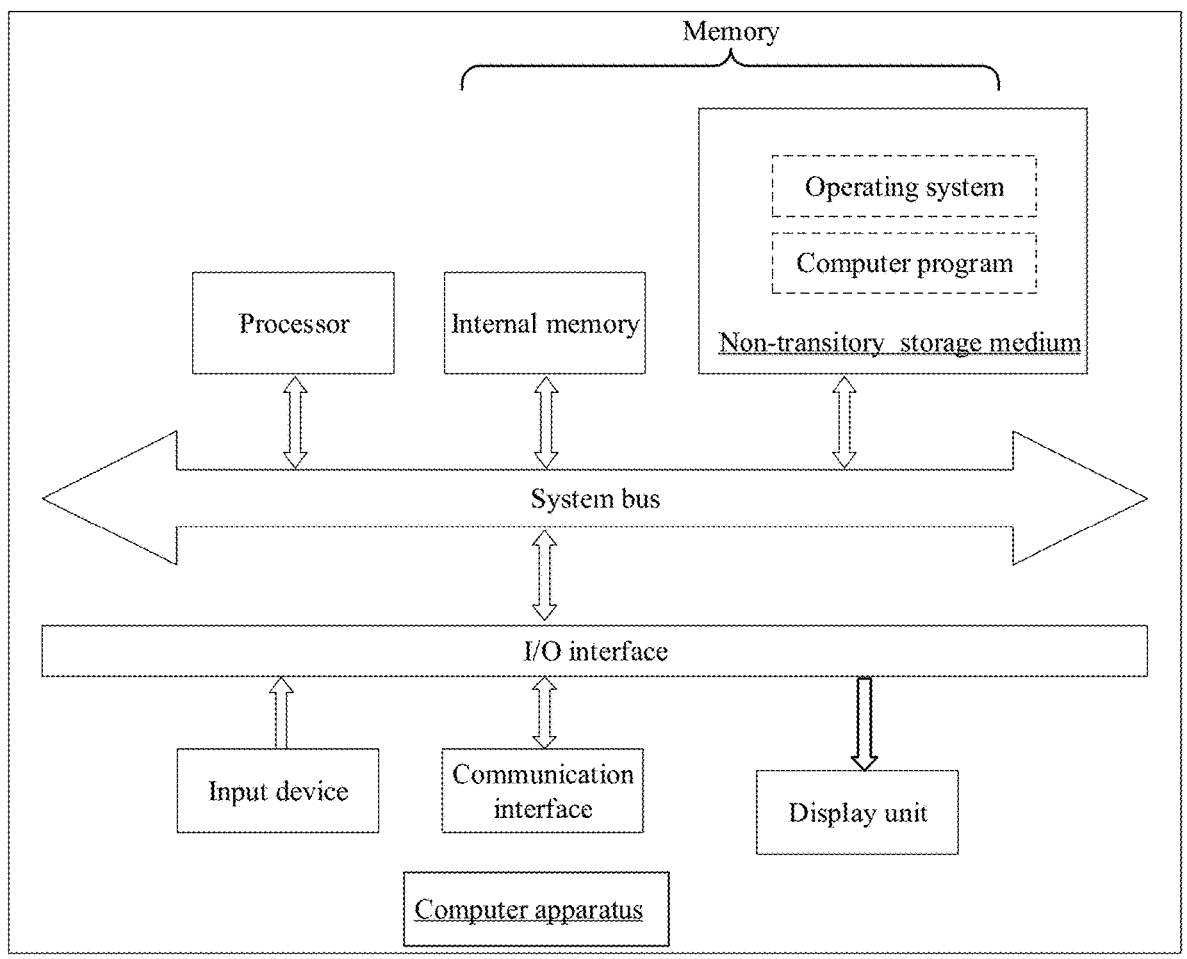
FIG. 12 is a diagram showing an internal structure of a computer device according to an embodiment.

In an embodiment, the present disclosure provides a computer device, which may be a terminal, and an internal structure diagram of the computer device may be shown in FIG. 12. The computer device includes a processor, a memory, a communication interface, a display unit, and an input device that are connected via a system bus. The processor of the computer device is configured to provide computing and control capabilities. The memory of the computer device includes a non-transitory storage medium and an internal memory. The non-transitory storage medium stores an operating system and computer programs. The internal memory provides an environment for running the operating system and the computer programs in the non-transitory storage medium. The communication interface of the computer device is configured to be in a wired or wireless communication with external terminals. The wireless communication may be realized by wireless fidelity (WIFI), mobile cellular network, near field communication (NFC), or other technologies. The computer program can be executed by the processor to implement the asymmetric compensation method for a two-port near field probe. The display unit of the computer device may be a liquid crystal display screen or an electronic ink display screen. The input device of the computer device may be a touch layer covered on the display unit, or it may be a key, a trackball, or a touchpad disposed on the housing of the computer device, and may also be an external keyboard, a touchpad, or a mouse.

Those skilled in the art should understand that the structure shown in FIG. 12 is merely a block diagram of a portion of the structures associated with the solution of the present disclosure, and does not constitute a limitation on the computer device to which the solutions of the present disclosure is applied. A specific computer device may include more or less components than those shown in the figure, or combine certain components, or have different component arrangements.

In an embodiment, the present disclosure further provides a computer device, including a memory having a computer program stored therein and a processor. The processor when executing the computer program, performs steps of the method in the foregoing embodiments.

In an embodiment, the present disclosure further provides a non-transitory computer readable storage medium, in which a computer program is stored. The computer program, when executed by a processor, causes the processor to perform steps of the method in foregoing embodiments.

In an embodiment, the present disclosure further provides a computer program product, including a computer program. The computer program, when executed by a processor, causes the processor to perform steps of the method in the foregoing embodiments.

It should be noted that user information (including but not limited to user equipment information, user personal information, etc.,) and data (including but not limited to data used for analysis, stored data, and displayed data, etc.,) related to the present disclosure are authorized by users or fully authorized by each party.

Those skilled in the art can understand that all or part of the processes of the methods of the above embodiments can be implemented by instructing relevant hardware through a computer program. The computer program can be stored in a non-transitory computer-readable storage medium, and when executed, perform the processes of the methods in the aforementioned embodiments. Any reference to a memory, a database or other medium used in the embodiments provided in the present disclosure may include at least one of non-transitory memory and transitory memory. The non-transitory memory may include a Read-Only Memory (ROM), a magnetic tape, a floppy disk, a flash memory, an optical memory, a high-density embedded non-transitory memory, a resistive random access memory (ReRAM), a Magnetoresistive Random Access Memory (MRAM), a Ferroelectric Random Access Memory (FRAM), a Phase Change Memory (PCM), or a graphene memory, etc. The transitory memory may include a Random Access Memory (RAM), an external cache memory, or the like. For illustration rather than limitation, the RAM may be in various forms, such as a Static Random Access Memory (SRAM) or a Dynamic Random Access Memory (DRAM). The database involved in the embodiments provided in the present disclosure may include at least one of a relational database or a non-relational database. The non-relational database may include a blockchain-based distributed database, etc., but is not limited thereto. The processors involved in the embodiments provided in present disclosure may be general-purpose processors, central processing units, graphics processors, digital signal processors, programmable logic devices, data processing logic devices based on quantum computing, etc., and is not limited to this.

The technical features in the foregoing embodiments may be randomly combined. For concise description, not all possible combinations of the technical features in the embodiments are described. However, provided that combinations of the technical features do not conflict with each other, the combinations of the technical features are considered as falling within the scope recorded in this specification.

The above-mentioned embodiments only illustrate several embodiments of the present disclosure, and the descriptions of which are relatively specific and detailed, but should not be construed as limitations to the scope of the present disclosure. It should be noted that, for those skilled in the art, variations and improvements can be made without departing from the concept of the present disclosure, which all belong to the protection scope of the present disclosure. Therefore, the protection scope of the present disclosure shall be subject to the appended claims.

What is claimed is:

1. An asymmetric compensation method for a two-port near field probe, comprising:

obtaining a first scattering parameter of a symmetric two-port near field probe, wherein the first scattering parameter is collected by a symmetric two-port network, the symmetric two-port network comprises the symmetric two-port near field probe and a vector network analyzer, the symmetric two-port near field probe comprises a second port and a fifth port, the vector network analyzer comprises a first interface, a second interface, a third interface, and a fourth interface, and the second port is connected to the second interface of the vector network analyzer;

obtaining a second scattering parameter of an asymmetric element, wherein the second scattering parameter is collected by an asymmetric two-port network, the asymmetric two-port network comprises the asymmetric element and the vector network analyzer, a third port of the asymmetric element is an output port and is connected to the third interface of the vector network analyzer, and an input port of the asymmetric element is connected to the fifth port of the symmetric two-port near field probe;

obtaining an overall response of a calibration network in a magnetic field environment, wherein the calibration network is established based on the symmetric two-port near field probe and the asymmetric element, the calibration network comprises the vector network analyzer, the symmetric two-port near field probe, the asymmetric element, and a calibrator, a first port and a fourth port arranged at two sides of the calibrator are respectively connected to the first interface and the fourth interface of the vector network analyzer, the second port of the symmetric two-port near field probe is connected to the second interface of the vector network analyzer, the fifth port of the symmetric two-port near field probe is connected to the asymmetric element, and the third port of the asymmetric element is connected to the third interface of the vector network analyzer;

calculating a calibration factor based on the first scattering parameter of the symmetric two-port near field probe, the second scattering parameter of the asymmetric element, and the overall response of the calibration network in the magnetic field environment; and compensating the symmetric two-port near field probe according to the calibration factor.

2. The asymmetric compensation method according to claim 1, wherein calculating the calibration factor based on the first scattering parameter of the symmetric two-port near field probe, the second scattering parameter of the asymmetric element, and the overall response of the calibration network in the magnetic field environment comprises:

performing a calculation based on the first scattering parameter of the symmetric two-port near field probe, the second scattering parameter of the asymmetric element, and the overall response of the calibration network in the magnetic field environment to obtain a response of the symmetric two-port near field probe in the magnetic field environment; and determining the calibration factor based on the response of the symmetric two-port near field probe in the magnetic field environment.

3. The asymmetric compensation method according to claim 2, wherein performing the calculation based on the first scattering parameter of the symmetric two-port near field probe, the second scattering parameter of the asymmetric element, and the overall response of the calibration network in the magnetic field environment to obtain the response of the symmetric two-port near field probe in the magnetic field environment comprises:

constructing a first transmission equation based on a first transmission link of the calibration network;

constructing a second transmission equation based on a second transmission link of the calibration network, wherein the first transmission link and the second transmission link are transmission links of the symmetric two-port near field probe in two opposite directions; and determining the response of the symmetric two-port near field probe in the magnetic field environment based on the first scattering parameter of the symmetric two-port near field probe, the second scattering parameter of the asymmetric element, the first transmission equation, and the second transmission equation.

4. The asymmetric compensation method according to claim 3, wherein determining the response of the symmetric two-port near field probe in the magnetic field environment based on the first scattering parameter of the symmetric two-port near field probe, the second scattering parameter of the asymmetric element, the first transmission equation, and the second transmission equation comprises:

transforming the first transmission equation and the second transmission equation to obtain a first response expression of the symmetric two-port near field probe in the magnetic field environment and a second response expression of the symmetric two-port near field probe in the magnetic field environment, respectively;

calculating a first response of the symmetric two-port near field probe in the magnetic field environment based on the overall response of the calibration network in the magnetic field environment, the scattering parameter of the symmetric two-port near field probe, the scattering parameter of the asymmetric element, a preset characteristic parameter, and the first response expression; and extracting an overall response of the second transmission link from the overall response of the calibration network in the magnetic field environment, and calculating a second response of the symmetric two-port near field probe in the magnetic field environment based on the overall response of the second transmission link, the second scattering parameter of the asymmetric element, the preset characteristic parameter, and the second response expression.

5. The asymmetric compensation method according to claim 2, wherein determining the calibration factor based on the response of the symmetric two-port near field probe in the magnetic field environment comprises:

determining an output voltage of the calibration network based on the response of the symmetric two-port near field probe in the magnetic field environment and a preset voltage expression;

obtaining a magnetic field signal; and obtaining the calibration factor based on the magnetic field signal and the output voltage.

6. The asymmetric compensation method according to claim 5, wherein obtaining the calibration factor based on the magnetic field signal and the output voltage comprises:

multiplying a logarithm of the magnetic field signal by a preset multiplier to obtain a magnetic field product;

dividing the output voltage by an input signal to obtain a signal divisor and determining an absolute value of the signal divisor; and calculating a difference between the magnetic field product and the absolute value of the signal divisor to obtain the calibration factor.

7. The asymmetric compensation method according to claim 1, wherein the symmetric two-port near field probe is located on a preset track of the calibrator.

8. The asymmetric compensation method according to claim 1, wherein the first scattering parameter is a reverse transmission coefficient of the fifth port to the second port, and the second scattering parameter is a reverse transmission coefficient of the fifth port to the third port.

9. A non-transitory computer readable storage medium, on which a computer program is stored, wherein the computer program, when executed by a processor, causes the processor to perform steps of the asymmetric compensation method according to claim 1.

10. An asymmetric compensation apparatus for a two-port near field probe, comprising:

a first obtaining module configured to obtain a first scattering parameter of a symmetric two-port near field probe, wherein the first scattering parameter is collected by a symmetric two-port network, the symmetric two-port network comprises the symmetric two-port near field probe and a vector network analyzer, the symmetric two-port near field probe comprises a second port and a fifth port, the vector network analyzer comprises a first interface, a second interface, a third interface, and a fourth interface, and the second port is connected to the second interface of the vector network analyzer;

a second obtaining module configured to obtain a second scattering parameter of an asymmetric element, wherein the second scattering parameter is collected by an asymmetric two-port network, the asymmetric two-port network comprises the asymmetric element and the vector network analyzer, a third port of the asymmetric element is an output port and is connected to the third interface of the vector network analyzer, and an input port of the asymmetric element is connected to the fifth port of the symmetric two-port near field probe;

a response obtaining module configured to obtain an overall response of a calibration network in a magnetic field environment, wherein the calibration network is established based on the symmetric two-port near field probe and the asymmetric element, the calibration network comprises the vector network analyzer, the symmetric two-port near field probe, the asymmetric element, and a calibrator, a first port and a fourth port arranged at two sides of the calibrator are connected to the first interface and the fourth interface of the vector network analyzer, respectively, the second port of the symmetric two-port near field probe is connected to the second interface of the vector network analyzer, the fifth port of the symmetric two-port near field probe is connected to the asymmetric element, and the third port of the asymmetric element is connected to the third interface of the vector network analyzer;

a calculation module configured to calculate a calibration factor based on the first scattering parameter of the symmetric two-port near field probe, the second scattering parameter of the asymmetric element, and the overall response of the calibration network in the magnetic field environment; and a compensation module configured to compensate the symmetric two-port near field probe according to the calibration factor.

11. A computer device comprising a memory and a processor, the memory storing a computer program, wherein the processor, when executing the computer program, is configured to perform an asymmetric compensation method for a two-port near field probe, wherein the method comprises:

obtaining a first scattering parameter of a symmetric two-port near field probe, wherein the first scattering parameter is collected by a symmetric two-port network, the symmetric two-port network comprising the symmetric two-port near field probe and a vector network analyzer, the symmetric two-port near field probe comprising a second port and a fifth port, the vector network analyzer comprising a first interface, a second interface, a third interface, and a fourth interface, the second port being connected to the second interface of the vector network analyzer;

obtaining a second scattering parameter of an asymmetric element, wherein the second scattering parameter is collected by an asymmetric two-port network, the asymmetric two-port network comprising the asymmetric element and the vector network analyzer, a third port of the asymmetric element being an output port and being connected to the third interface of the vector network analyzer, an input port of the asymmetric element being connected to the fifth port of the symmetric two-port near field probe;

obtaining an overall response of a calibration network in a magnetic field environment, wherein the calibration network is established based on the symmetric two-port near field probe and the asymmetric element, the calibration network comprises the vector network analyzer, the symmetric two-port near field probe, the asymmetric element, and a calibrator, a first port and a fourth port arranged at two sides of the calibrator are connected to the first interface and the fourth interface of the vector network analyzer, respectively, the second port of the symmetric two-port near field probe is connected to the second interface of the vector network analyzer, the fifth port of the symmetric two-port near field probe is connected to the asymmetric element, and the third port of the asymmetric element is connected to the third interface of the vector network analyzer;

calculating a calibration factor based on the first scattering parameter of the symmetric two-port near field probe, the second scattering parameter of the asymmetric element, and the overall response of the calibration network in the magnetic field environment; and compensating the symmetric two-port near field probe according to the calibration factor.

* * * * *